United States Patent
Cheng et al.

(10) Patent No.: US 9,406,566 B1
(45) Date of Patent: Aug. 2, 2016

(54) INTEGRATION OF III-V COMPOUND MATERIALS ON SILICON

(71) Applicant: International Business Machines Corporation, Armonk, NY (US)

(72) Inventors: Cheng-Wei Cheng, White Plains, NY (US); Sanghoon Lee, White Plains, NY (US); Kuen-Ting Shiu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/959,268

(22) Filed: Dec. 4, 2015

(51) Int. Cl.
| | |
|---|---|
| H01L 21/8234 | (2006.01) |
| H01L 21/02 | (2006.01) |
| H01L 29/78 | (2006.01) |
| H01L 29/267 | (2006.01) |
| H01L 29/66 | (2006.01) |

(52) U.S. Cl.
CPC .... *H01L 21/823431* (2013.01); *H01L 21/0254* (2013.01); *H01L 21/02381* (2013.01); *H01L 21/02436* (2013.01); *H01L 21/02461* (2013.01); *H01L 21/02463* (2013.01); *H01L 21/02496* (2013.01); *H01L 21/02543* (2013.01); *H01L 21/02546* (2013.01); *H01L 21/02549* (2013.01); *H01L 29/267* (2013.01); *H01L 29/66522* (2013.01); *H01L 29/66795* (2013.01); *H01L 29/7848* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 2015/0287779 | A1* | 10/2015 | Jhaveri | H01L 29/66795 257/401 |
| 2016/0064530 | A1* | 3/2016 | Liu | H01L 29/66795 438/429 |
| 2016/0064557 | A1* | 3/2016 | Xiao | H01L 29/7827 257/329 |

OTHER PUBLICATIONS

Strittmatter, A., A. Krost, M. Stra M. Straßburg, burg, V. Turck, D. Bimberg, J. Blasing, and J. Christen. "Low-pressure Metal Organic Chemical Vapor Deposition of GaN on Silicon(111) Substrates Using an AlAs Nucleation Layer." Appl. Phys. Lett. 74.9 (1999): 1242.*
Jothilingam, R., M. W. Koch, J. B. Posthill, and G. W. Wicks. "A Study of Cracking in GaN Grown on Silicon by Molecular Beam Epitaxy." Journal of Electronic Materials Journal of Elec Materi 30.7 (2001): 821-24.*
Lu, Y., "III-V Compound Semiconductor Selective Area Epitaxy on Silicon Substrates", Thesis in Department of Electrical and Computer Engineering, University of Illinois, Urbana Illinois 2014.*

* cited by examiner

*Primary Examiner* — Joseph Schoenholtz
(74) *Attorney, Agent, or Firm* — Cantor Colburn LLP; Louis Percello

(57) ABSTRACT

A method of forming a semiconductor device is provided. The method includes depositing an aluminum-base interlayer on a silicon substrate, the aluminum-base interlayer having a thickness of less than about 100 nanometers; and growing a III-V compound material on the aluminum-base interlayer. The aluminum-base interlayer deposited directly on silicon allows for continuous and planar growth of III-V compound materials on the interlayer, which facilitates the manufacture of high quality electronic devices.

3 Claims, 21 Drawing Sheets

INTEGRATION OF III-V COMPOUND MATERIALS ON SILICON

BACKGROUND

The present disclosure relates to methods of integrating III-V compounds on silicon, and semiconductor devices formed using the methods.

Group III-V compounds are a unique group of semiconductor materials that can be used in a wide variety of applications such as optoelectronics, photovoltaics and lighting. However, III-V compounds and silicon have different crystal structures and different lattice constants. Accordingly, it can be challenging to integrate III-V compounds on silicon because structure and lattice mismatches can cause dislocations and defects in the materials. For example compound III-V semiconductors grown directly on silicon often show island-like structures due to the strains caused by lattice mismatch. Various methods have been proposed to grow continuous and planar III-V layers on silicon. Despite all the advances, the art is well receptive to new methods to integrate III-V compounds on silicon.

SUMMARY

In an embodiment of the invention, a method of forming a semiconductor device is provided. The method includes depositing an aluminum-base interlayer on a silicon substrate, the aluminum-base interlayer having a thickness of less than about 100 nanometers; and growing a III-V compound material on the aluminum-base interlayer.

In another embodiment of the invention, a method for fabricating a fin field effect transistor is provided. The method includes depositing an aluminum-base interlayer on a silicon substrate, the aluminum-base interlayer having a thickness of less than about 100 nanometers; growing a III-V compound material on the aluminum-base interlayer; forming a III-V compound material fin; forming at least one sacrificial gate stack over the fin; forming source/drain regions on exposed portions of the fin; removing the sacrificial gate to expose channel regions of the fin; depositing a layer of dielectric material over the channel regions of the fin; depositing a block mask to obscure a channel region of the fin; removing the layer of dielectric material from exposed channel regions of the fin; removing the block mask; depositing a high-k dielectric layer; and depositing a work function metal to form a gate stack.

In yet another embodiment of the invention, a semiconductor device is provided. The device includes a silicon substrate; an aluminum-base interlayer deposited on the silicon substrate, the aluminum-base interlayer having a thickness of less than about 100 nanometers; and a III-V compound material grown on the aluminum-base interlayer.

BRIEF DESCRIPTION OF THE DRAWINGS

The following descriptions should not be considered limiting in any way. With reference to the accompanying drawings, like elements are numbered alike:

FIGS. 1A through 1C illustrate an exemplary method of making a semiconductor device according to an embodiment of the disclosure, in which:

FIG. 1A is a cross-sectional view of a blanket substrate;

FIG. 1B is a cross-sectional view of the blanket substrate having an aluminum-base interlayer formed thereon; and FIG. 1C is a cross-sectional view after growing a III-V compound material on the aluminum-base interlayer;

FIGS. 4A through 4C illustrate an exemplary method of making a semiconductor device according to another embodiment of the disclosure, in which:

FIG. 4A is a cross-sectional view of a patterned structure according to an embodiment;

FIG. 4B is a cross-sectional view after depositing an aluminum-base layer on silicon; and FIG. 4C is a cross-sectional view after growing a III-V compound material on the aluminum-base interlayer;

FIGS. 7A through 7C illustrate an exemplary method of making a semiconductor device according to yet another embodiment of the disclosure, in which:

FIG. 7A is a cross-sectional view of a patterned structure;

FIG. 7B is a cross-sectional view after depositing an aluminum-base layer on silicon; and FIG. 7C is a cross-sectional view after growing a III-V compound material on the aluminum-base interlayer;

DETAILED DESCRIPTION

Figure 1A:

Layer by layer planar growth of III-V compound materials is advantageous in many applications in the semiconductor industry. To prompt planar growth, a wetting layer may be applied as a bridge between silicon and the III-V compound materials. A wetting layer can be an As-terminated surface created by pre-flowing $AsH_3$ on silicon. However, such a wetting layer may not be sufficient for integrating III-V compound materials on silicon for certain applications. In addition, the structures fabricated by the method usually have a GaAs interlayer between silicon and the III-V compound semiconductor.

Methods and devices are provided that include an aluminum-base interlayer having a thickness of less than about 100 nanometers between silicon and a grown III-V compound layer. In the devices made by the method, the first layer deposited directly on silicon is an aluminum-base material rather than GaAs. The aluminum-base interlayer provides strong bonding with both the silicon substrate and the III-V compound layer, which allows for a continuous and planar growth of III-V materials on a blanket or patterned silicon substrate.

As used herein, silicon substrate includes monocrystalline Si, SiGe, SiC, and semiconductor-on-insulator (SOI). Before further processing, the substrate can be baked to remove native oxide and other impurities. The baking process may optionally include a reactive gas such as $AsH_3$ or other reactive gases depending on the impurities that are to be reduced or eliminated. Alternatively or in addition, a wet etch or other chemical treatment may be employed to clean the substrate.

The aluminum-base interlayer is disposed on silicon using an epitaxial growth process. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. In an embodiment, the aluminum-base interlayer is formed using an atomic layer deposition or a chemical vapor deposition process. Upon formation of the interlayer, another bake process may be employed to prepare the interlayer to receive a III-V compound layer.

The aluminum-base interlayer is typically one to a few atoms thick. In an embodiment, the interlayer has a thickness of less than about 100 nanometers, less than about 50 nanometers, less than about 20 nanometers, from about 0.1 nanometer to about 50 nanometers, from about 0.1 nanometer to about 20 nanometers, from about 0.1 nanometer to about 10 nanometers, or from about 0.5 nanometer to about 5 nanometers. In an embodiment, the interlayer on a patterned substrate has a thickness of about 0.1 nanometer to about 15 nanometers, and the interlayer on a blanket substrate has a thickness of about 0.5 nanometer to about 50 nanometers. Advantageously, a very thin interlayer is sufficient to facilitate the integration of III-V compound materials on silicon.

The interlayer includes AlAs, AlP, AlInP, InAlAs, AlGaAs, or other materials that function in accordance with the present principles. In an exemplary embodiment, the interlayer includes AlAs or AlP, specifically AlAs.

An epitaxial growth process is employed to grow III-V compound materials on the aluminum-base layer. The III-V materials may include, e.g., InGaAs, InP, GaAs, GaN, GaP, GaSb, AlGaAs, AlInGaAs, GaInP, combinations thereof, or any other III-V compound materials. The III-V materials in the compound layers are compositionally different from the materials in the aluminum-base interlayer.

Dielectric materials include, for example, an oxide, a nitride, an oxynitride, or any combination thereof. Other mask materials such as BN can also be used. Examples of oxide include SiOx, and AlOx etc.

Figure 1B:
Figure 1C:
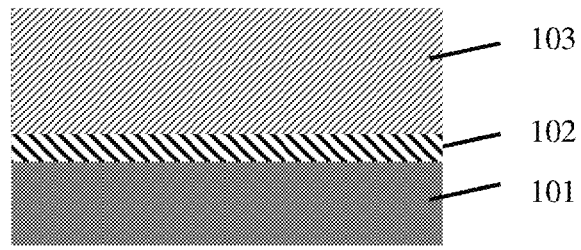

Turning now to the Figures, FIGS. 1A through 1C illustrate an exemplary method of making a semiconductor device according to an embodiment of the disclosure. FIG. 1A is a cross-sectional view of a blanket substrate 101. The substrate comprises silicon. FIG. 1B is a cross-sectional view of the blanket substrate 101 having an aluminum-base interlayer 102 formed thereon. FIG. 1C is a cross-sectional view after forming a III-V compound layer 103 on the aluminum-base interlayer 102. An epitaxial growth process is employed to grow a III-V compound layer 103.

Figure 2:
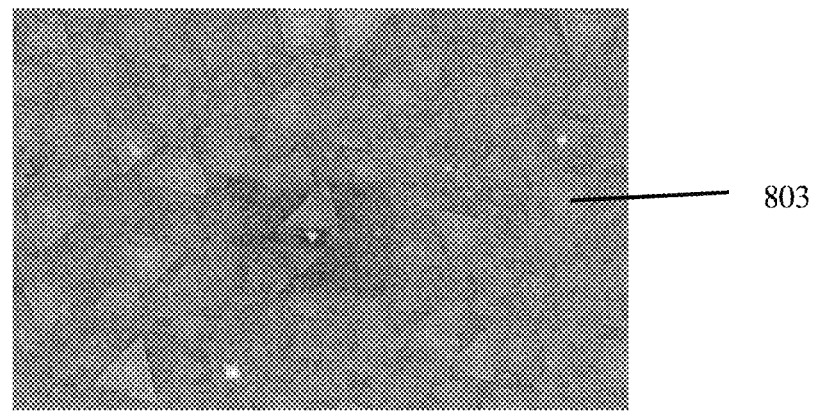
FIG. 2 is a scanning electron microscope (SEM) image showing a smooth and continuous InGaAs layer formed on a blanket silicon (111) substrate via an aluminum-base interlayer.
Figure 3:
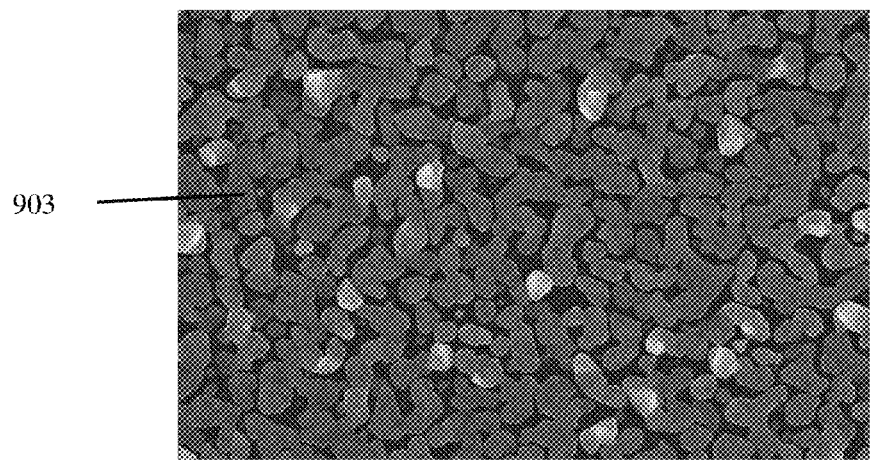
FIG. 3 is a SEM image showing an InGaAs layer formed directly on a blanket silicon (111) substrate without any aluminum-base interlayer disposed between the InGaAs layer and the silicon (111) substrate.

The III-V compound materials can grow continuously and uniformly in a layer by layer pattern on the aluminum-base interlayer. FIG. 2 is a SEM image showing a smooth and continuous InGaAs layer 803 formed on a blanket silicon (111) substrate via an aluminum-base interlayer. As a comparison, FIG. 3 is a SEM image of an InGaAs layer formed directly on a blanket silicon (111) substrate without any aluminum-base interlayer disposed between the InGaAs layer and the silicon (111) substrate. As shown in FIG. 3, III-V compounds grown directly on silicon are discontinuous and have island-like structures 903.

Figure 4A:
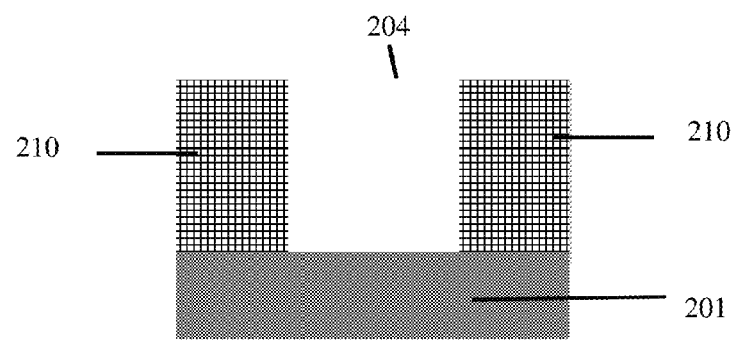
Figure 4B:
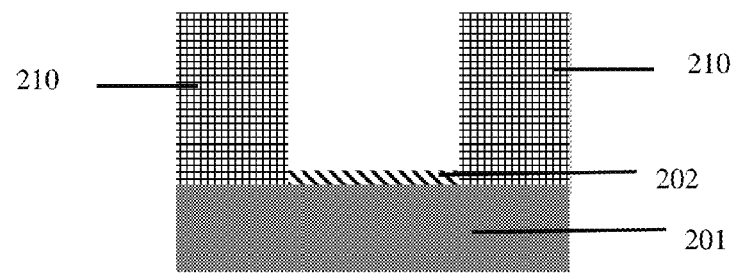
Figure 4C:
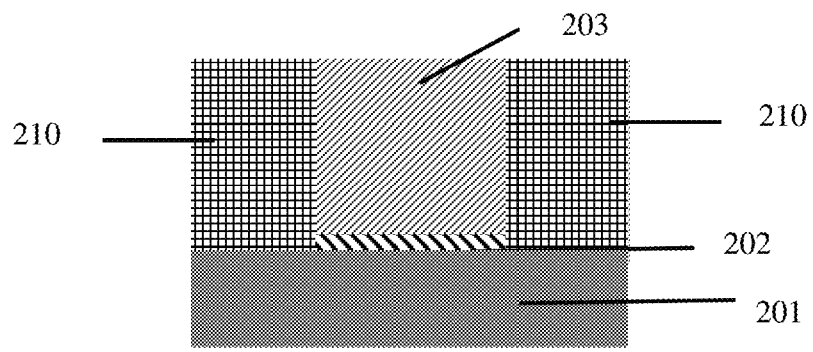

A III-V compound material can also grow on patterned silicon substrates. FIGS. 4A through 4C illustrate an exemplary method of making a semiconductor device according to another embodiment of the disclosure. FIG. 4A is a cross-sectional view of a patterned structure comprising a silicon substrate 201 and dielectric stacks 210 deposited on the silicon substrate. The dielectric stacks form trenches 204 having a selected aspect ratio. The patterned structure can be fabricated by known methods. For example, a method of forming the patterned structure 201 comprises providing a silicon substrate having a dielectric layer on a surface of the substrate, and forming trenches within the dielectric layer to expose a plurality of surface portions of substrate within the trenches.

The dielectric layer or dielectric stacks comprise a dielectric material. In an embodiment, the dielectric layer or dielectric stacks comprise an oxide such as silicon oxide.

An aluminum interlayer 202 is then deposited on the silicon substrate 201 between dielectric stacks 210 as shown in FIG. 4B using an epitaxial growth process as described herein. Next, a III-V material 203 is selectively grown starting on interlayer 202 and grows up to a top surface of the dielectric stacks 210 or beyond as shown in FIG. 4C. The silicon substrate, the dielectric stacks, and the III-V compound materials can be further processed for forming transistors or any other electronic device.

Figure 5:
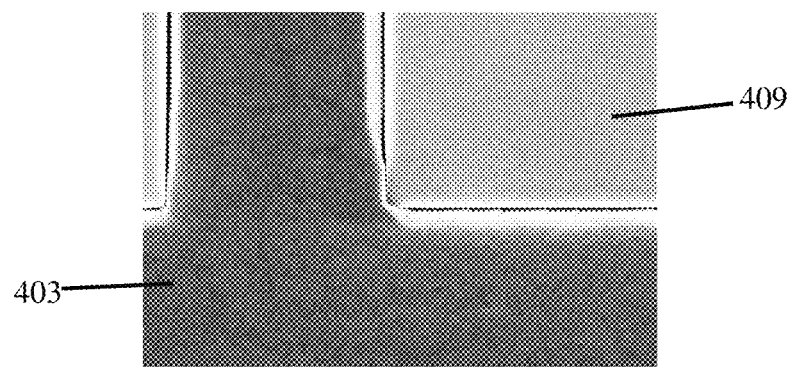
FIG. 5 is a SEM image showing a smooth and continuous InP layer formed on a patterned silicon substrate via an aluminum-base interlayer.
Figure 6:
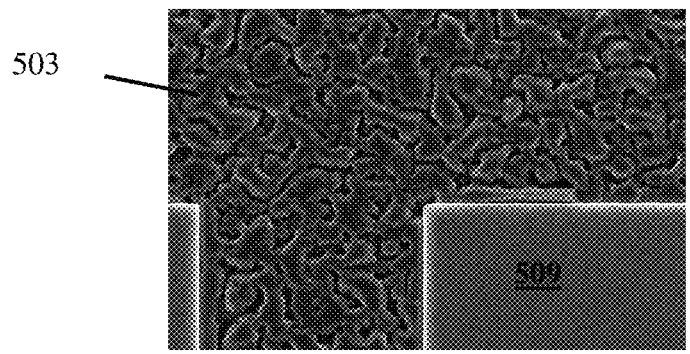
FIG. 6 is a SEM image showing an InP layer formed directly on a patterned silicon substrate without an aluminum-base interlayer disposed between the InP layer and the silicon substrate.

FIG. 5 is a SEM image showing an InP layer formed between silicon dioxide dielectric stacks on an aluminum-base interlayer (AlAs) deposited directly on a silicon substrate. As shown in FIG. 5, the InP layer 403 formed between dielectric stacks 409 via an aluminum-base interlayer is smooth and continuous. In contrast, FIG. 6 is a SEM image showing an InP layer formed directly on a patterned silicon substrate without an aluminum-base interlayer disposed between the InP layer and the silicon substrate. As shown in FIG. 6, the InP layer grown directly on a silicon substrate between dielectric stacks 509 are discontinuous and have island-like structures 503.

Figure 7A:
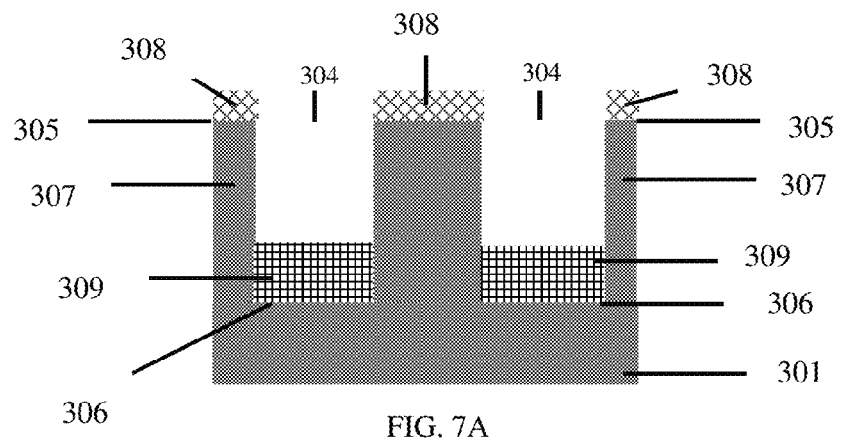
Figure 7B:
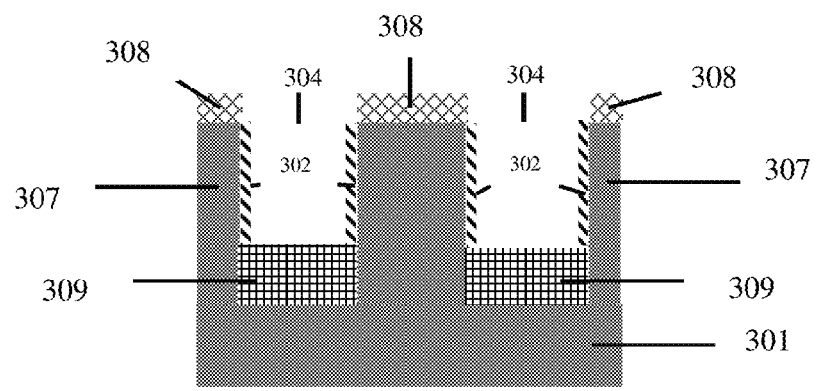
Figure 7C:
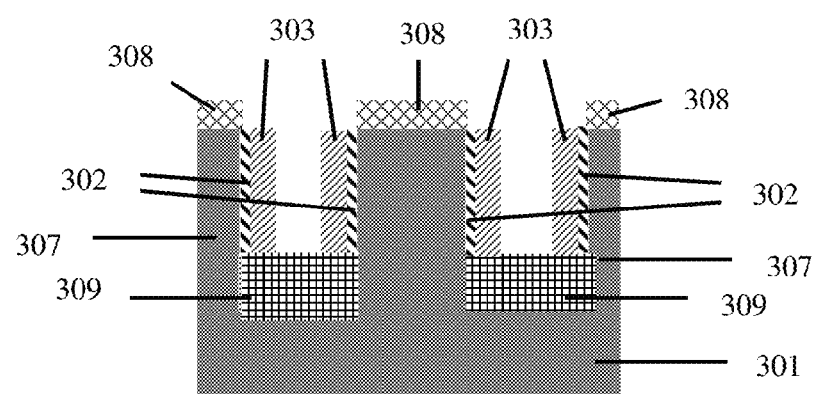

FIGS. 7A through 7C illustrate an exemplary method of making a semiconductor device according to yet another embodiment of the disclosure. FIG. 7A shows a silicon substrate 301 having parallel silicon fins 307 forming trenches 304. Dielectric layers 309 are deposited at the bottom (306) of the trenches 304. In addition, a hard mask material 308 is deposited on the top surface (305) of the silicon fins 307. An exemplary method of forming the patterned structure shown in FIG. 7A includes depositing a hard mask material 308 such as SiNx on a silicon substrate; patterning and removing portions of the hard mask material 308 and the silicon substrate 301, for example, by dry-etch or by anisotropic wet-etch, to form trenches 304 and silicon fins 307; filing the trenches with a dielectric material optionally followed by a planarization process such as chemical mechanical polishing; and recessing the dielectric material in the trenches forming layers 309 deposited at the bottom of the trenches 304.

Referring to FIG. 7B, inside trenches 304, aluminum-base interlayers 302 are deposited on the exposed surfaces of silicon fins 307 using an epitaxial growth process such as CVD or ALD. A III-V compound layer 303 can grow on the aluminum-base interlayer 302 as shown in FIG. 7C. The structure shown in FIG. 7C can be further processed for forming transistors or any other electronic device.

Figure 8:
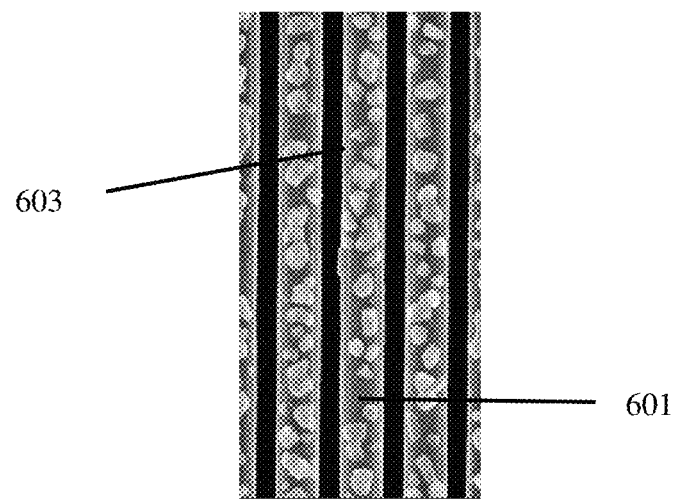
FIG. 8 is a SEM image showing smooth and continuous InGaAs layers formed on silicon fins via aluminum-base interlayers.
Figure 9:
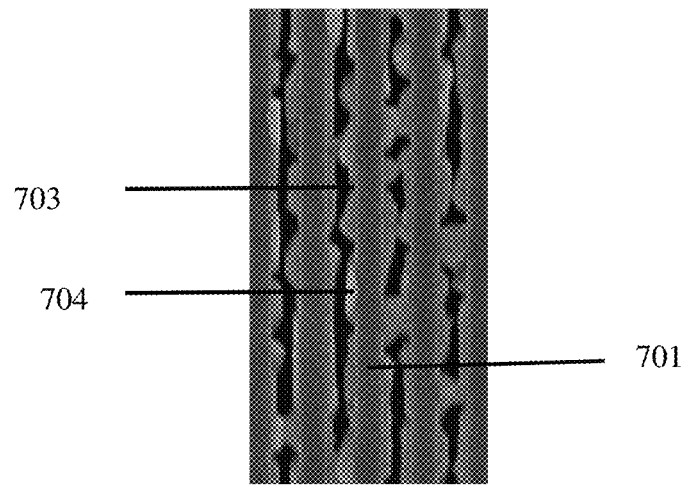
FIG. 9 is a SEM image showing InGaAs layers formed directly on silicon fins without any intervening aluminum-base interlayers.

FIG. 8 is a SEM image showing smooth and continuous InGaAs layers formed on silicon fins via aluminum-base interlayers; and FIG. 9 is a SEM image showing InGaAs layers formed directly on silicon fins without any intervening aluminum-base interlayers. In FIG. 8, InGaAs forms a continuous and uniform layers 603 on silicon fins 601. In contrast, in FIG. 9, InGaAs forms discontinuous films 703 on silicon fins 701. The films have island-like structures 704. These figures demonstrate that a thin aluminum-base interlayer deposited directly on silicon allows for continuous and planar growth of III-V compound materials on the interlayer, which facilitates the manufacture of high quality electronic devices.

The semiconductors disclosed herein can be further processed to form transistors or any other electronic device. An exemplary method of forming a fin field effect transistor (FET) device is illustrated in FIGS. 10-20 starting from the structure shown in FIG. 7C.

Figures 10, 11:
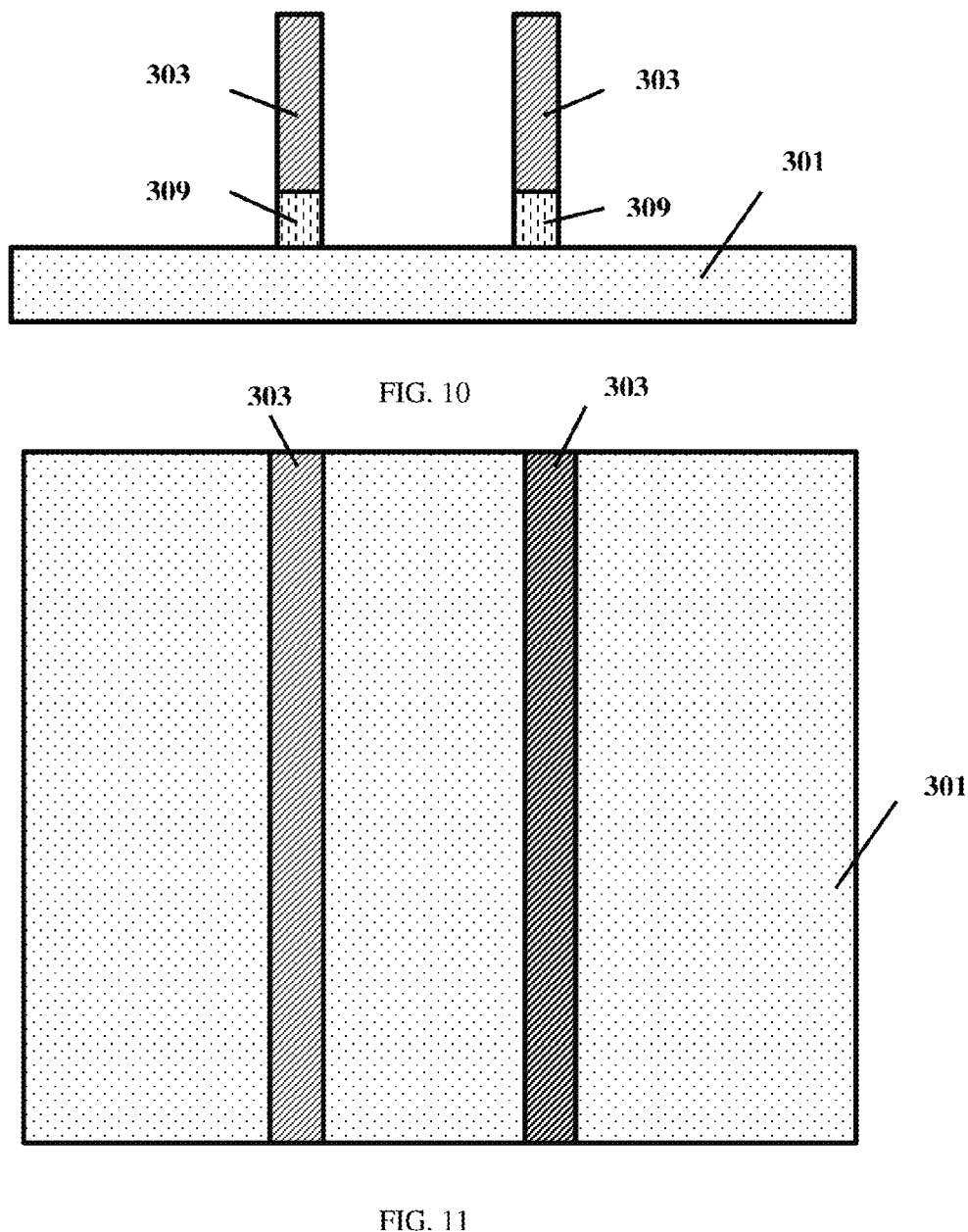
FIG. 10 illustrates a side view of the formation of III-V compound material fins from the structure of FIG. 7(C) following an etching process.
FIG. 11 illustrates a top view of the III-V compound material fin structure shown in FIG. 10.

FIG. 10 illustrates a side view of the formation of III-V compound material fins 303 following an etching process such as, for example, reactive ion etching that removes exposed portions of the dielectric layers 309 and silicon fins 307, and exposes portions of the substrate 301.

FIG. 11 illustrates a top view of the III-V compound material fin structure shown in FIG. 10.

Figure 12:
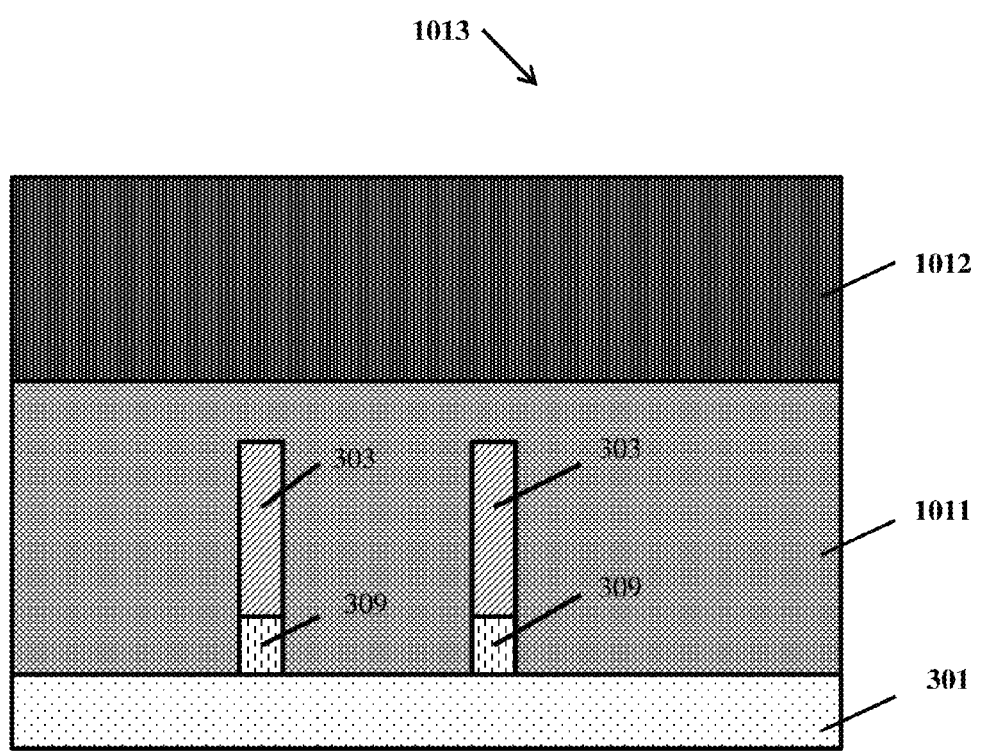
FIG. 12 illustrates a side view of the resultant structure following the deposition of a sacrificial gate.

FIG. 12 illustrates a side view of the resultant structure following the deposition of a layer of sacrificial gate (dummy gate) material 1011 that may include, for example, a polysilicon material, or oxide material. Following the deposition of the layer of sacrificial gate material 1011, a hard mask material 1012 is deposited on the sacrificial gate material 1011.

Following the deposition of the hard mask material 1012, a patterning and etching process is performed to remove portions of the hard mask material 1012 and the sacrificial gate material 1011 to expose portions of the substrate 301 and form sacrificial gate stacks 1013.

Figure 13:
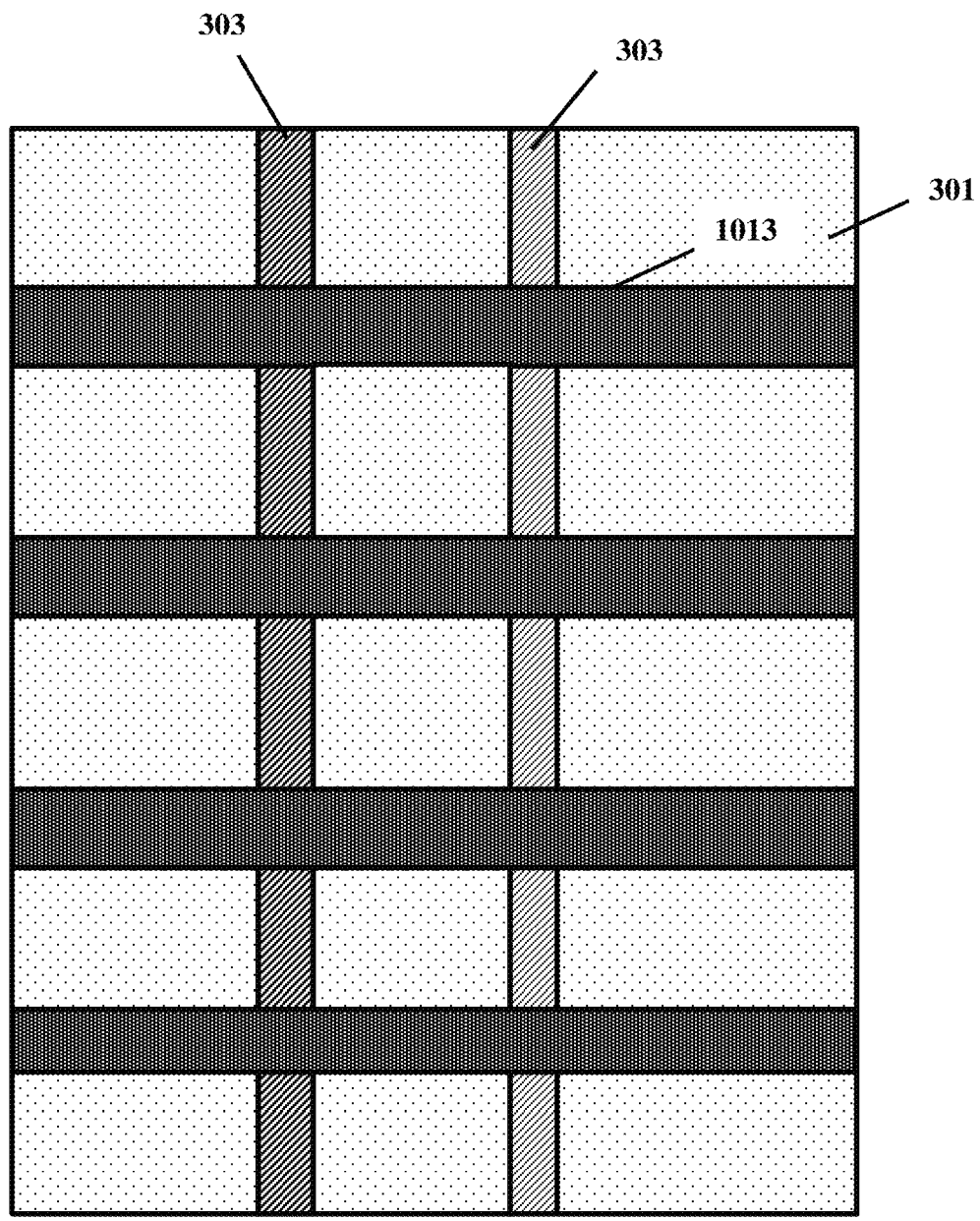
FIG. 13 illustrates a top view of the sacrificial gate stacks arranged on the substrate.

FIG. 13 illustrates a top view of the sacrificial gate stacks 1013 arranged on the substrate 301. In an embodiment, the sacrificial gate stacks are evenly spaced such that the side walls of the sacrificial gate stacks 1013 are spaced a uniform distance from each other.

Figure 14:
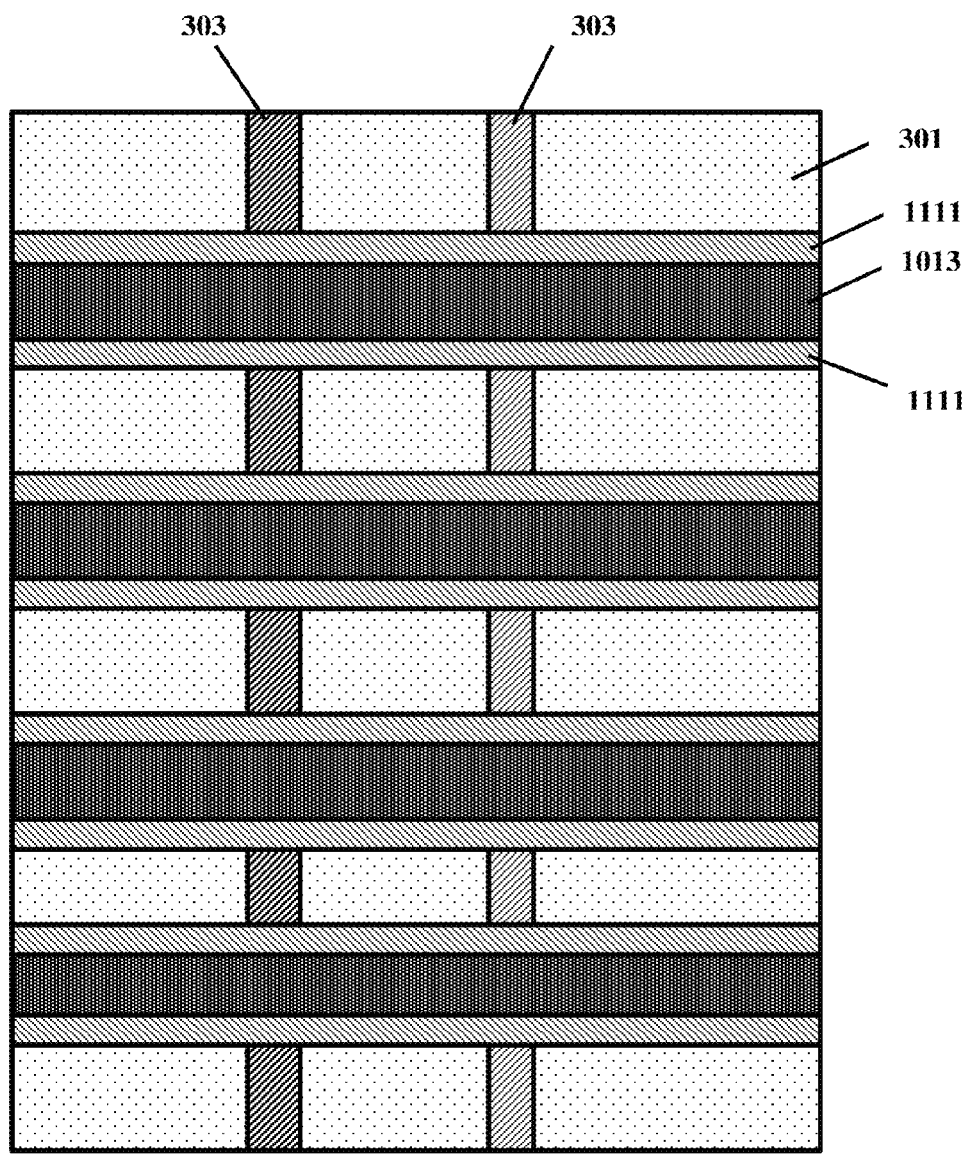
FIG. 14 illustrates a top view following the formation of sidewall spacers adjacent to the sacrificial gate stacks.

FIG. 14 illustrates a top view following the formation of sidewall spacers 1111 adjacent to the sacrificial gate stacks 1013. The spacers 1111 are formed from a low-k spacer material. The low-k spacer material may contain Si, N, and at least one element selected from the group consisting of C and B. Additionally, the low-k spacer material may contain Si, N, B, and C. For example, the low-k spacer material may include SiBN, SiCN, SiBCN, or any combination thereof. The spacers 1111 are formed by depositing a layer of the low-k spacer material and performing an anisotropic etching process such as, for example, reactive ion etching that forms the resultant spacers 1111. It is appreciated that spacers 1111 are optional. For example, if the subsequent sour/drain epitaxy does not cause any nucleation on the sidewalls of the sacrificial gate stack 1013, such spacers are not necessary.

Figure 15:
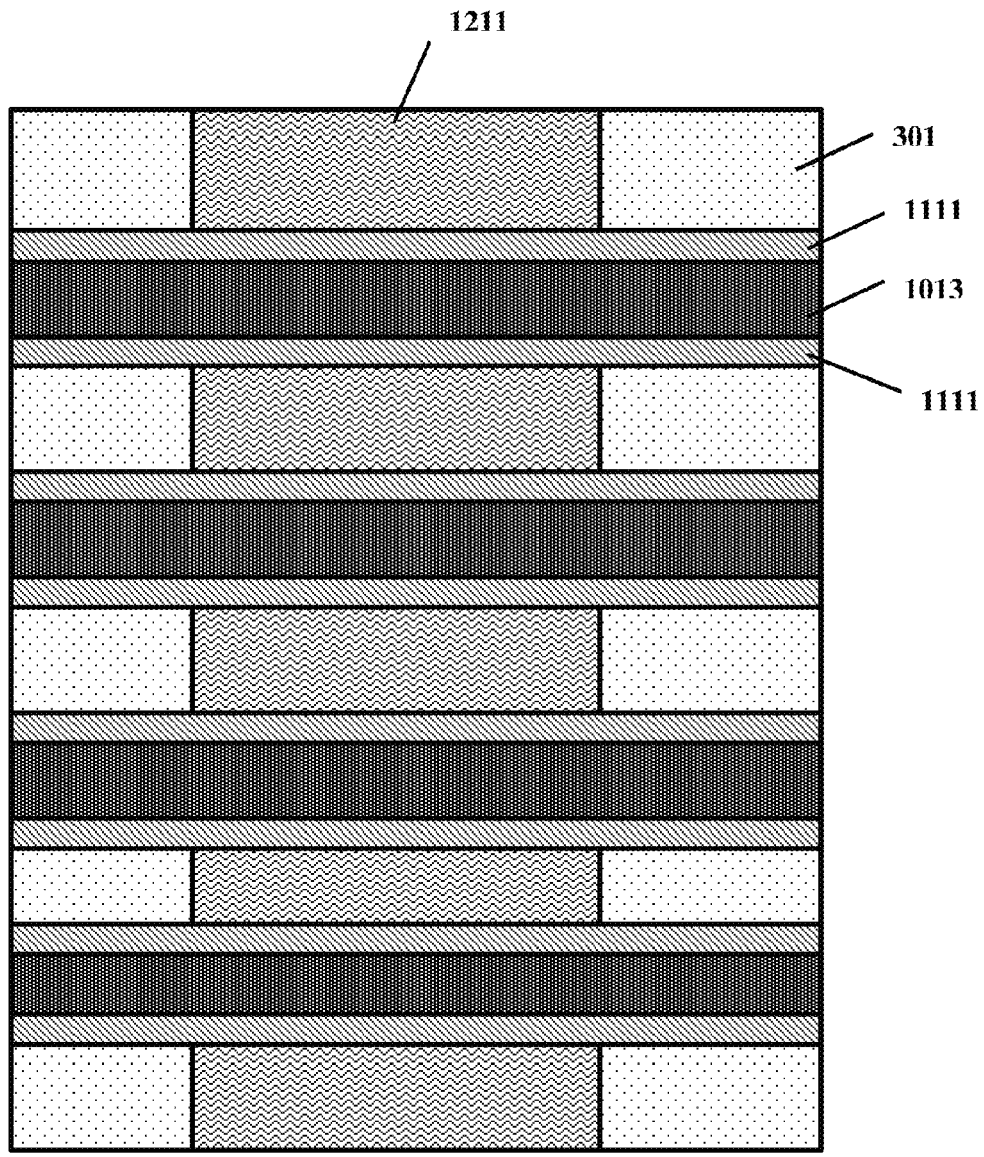
FIG. 15 illustrates a top view following the formation of source/drain regions over exposed portions of the dielectric layer.

FIG. 15 illustrates a top view of following the formation of source/drain regions 1211 over exposed portions of III-V compound fins 303 (FIG. 10). The source/drain regions 1211 of the illustrated embodiment are formed by, an epitaxial growth process.

An epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device.

Figure 16A:
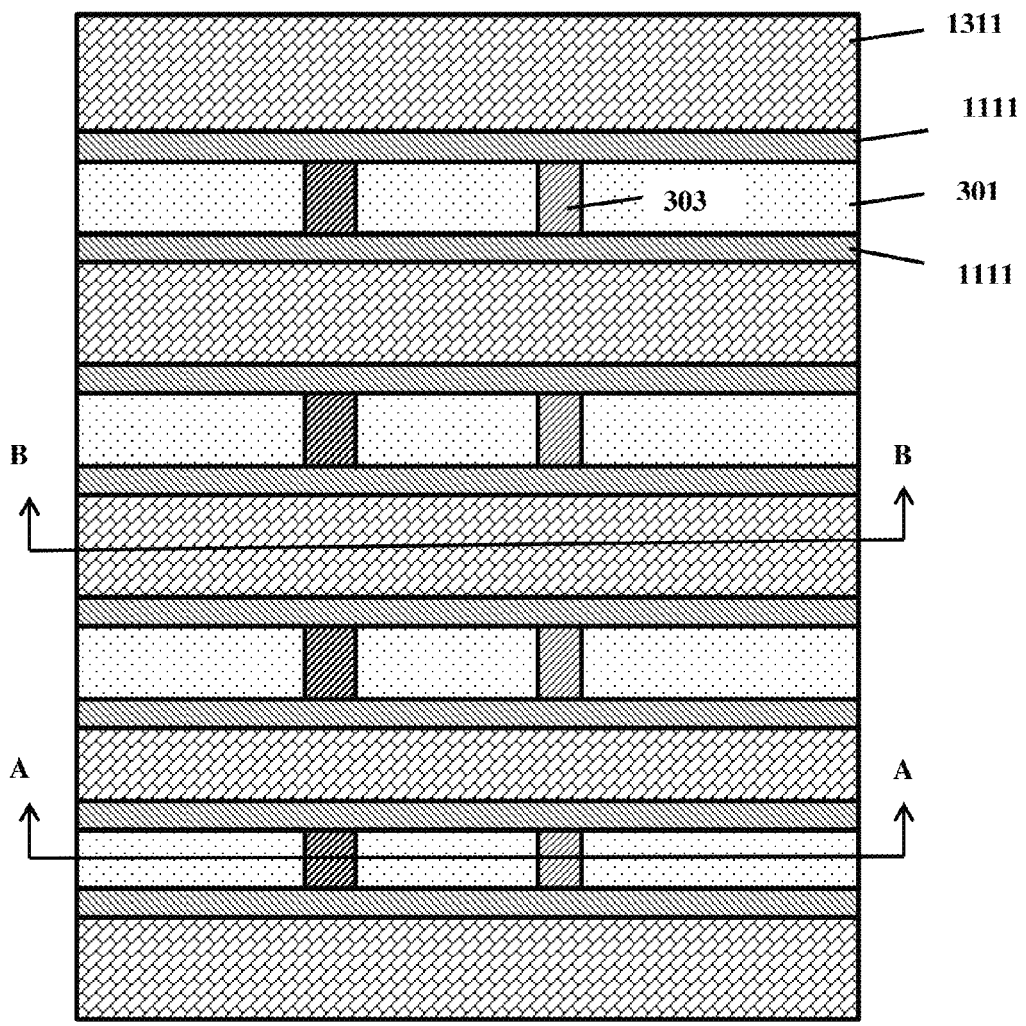
FIG. 16A illustrates a top view of the resultant structure following the deposition of an insulator layer.

FIG. 16A illustrates a top view of the resultant structure following the deposition of an insulator layer 1311 that may include, for example, an oxide material over exposed portions of the source/drain regions 1211 (of FIG. 15) and portions of the substrate 301, and the removal of the sacrificial gate stacks 1013 (of FIG. 15). The removal of the sacrificial gate stacks 1013 exposes channel regions of the fins 303 (of FIG. 10). The sacrificial gate stacks 1013 may be removed by any suitable selective etching process. In an embodiment, the insulator layer 1311 is deposited thicker than that of the sacrificial gate stacks 1013 after FIG. 15. Then the insulator 1311 is polished stopping on the hard mask material 1012.

Figure 16B:
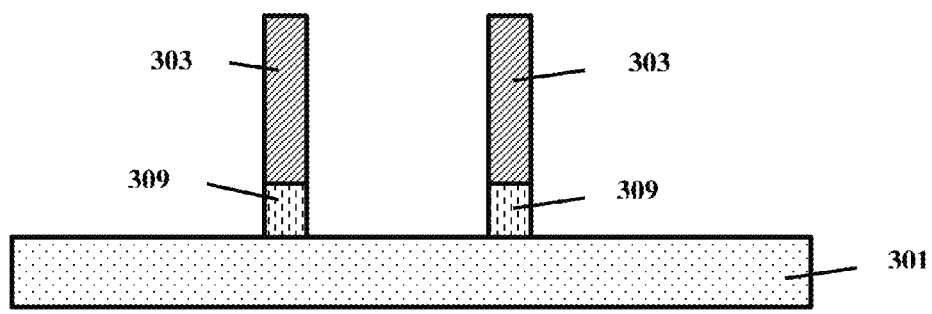
FIG. 16B illustrates a cut-away view of the structure along the line A-A of FIG. 16A.

FIG. 16B illustrates a cut-away view along the line A-A of FIG. 16A. Referring to FIG. 16B, the substrate 301 is shown with the dielectric layers 309 and the fins 303 disposed on the dielectric layers 309.

Figure 16C:
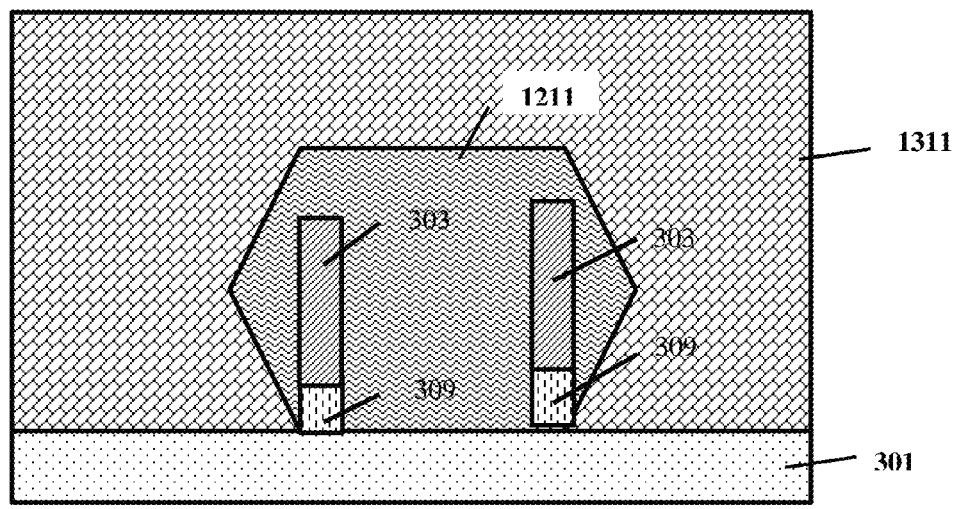
FIG. 16C illustrates a cut-away view of the structure along the line B-B of FIG. 16A.

FIG. 16C illustrates a cut-away view along the line B-B of FIG. 16A. The III-V compound fins 303 are shown with the source/drain region 1211 grown over the fins 303. The insulator layer 1311 is disposed over the source/drain region 1211.

Figure 17A:
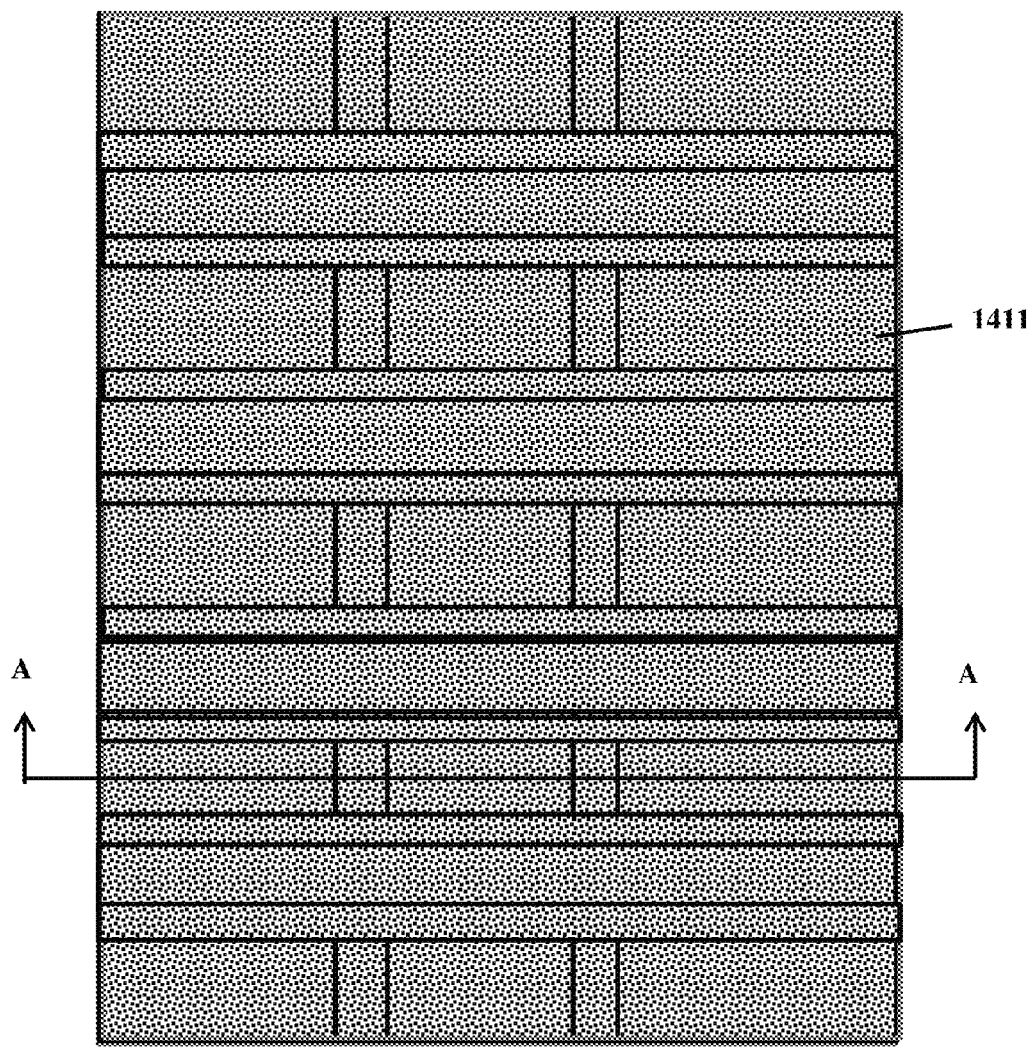
FIG. 17A illustrates a top view of the resultant structure following the deposition of a dielectric material layer.

FIG. 17A illustrates a top view of the resultant structure following the deposition of a dielectric material layer 1411. The dielectric material 1411 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The dielectric layer 1202 may include, for example, oxides, nitrides, oxynitrides, silicates (e.g., metal silicates), aluminates, titanates, or any combination thereof. Exemplary materials for layer 1202 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof.

Figure 17B:
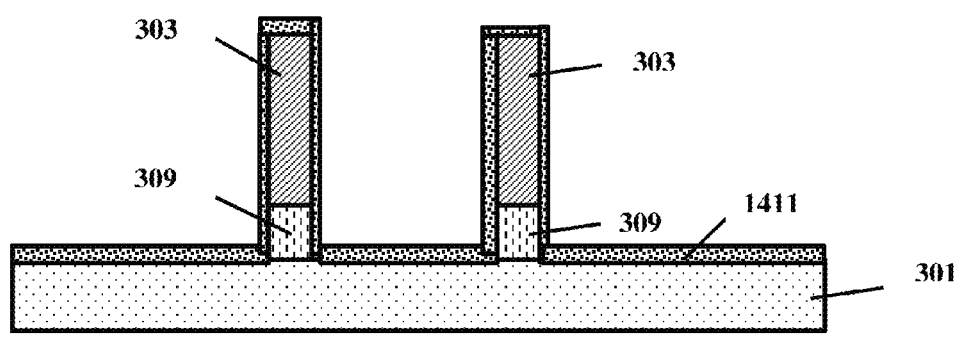
FIG. 17B illustrates a cut-away view of the structure along the line A-A of FIG. 17A.

FIG. 17B illustrates a cut-away view along the line A-A of FIG. 17A. Referring to FIG. 17B, the dielectric material layer 1411 is formed over exposed portions of the substrate 301, the III-V compound fins 303, and the dielectric layer 309.

Figure 18A:
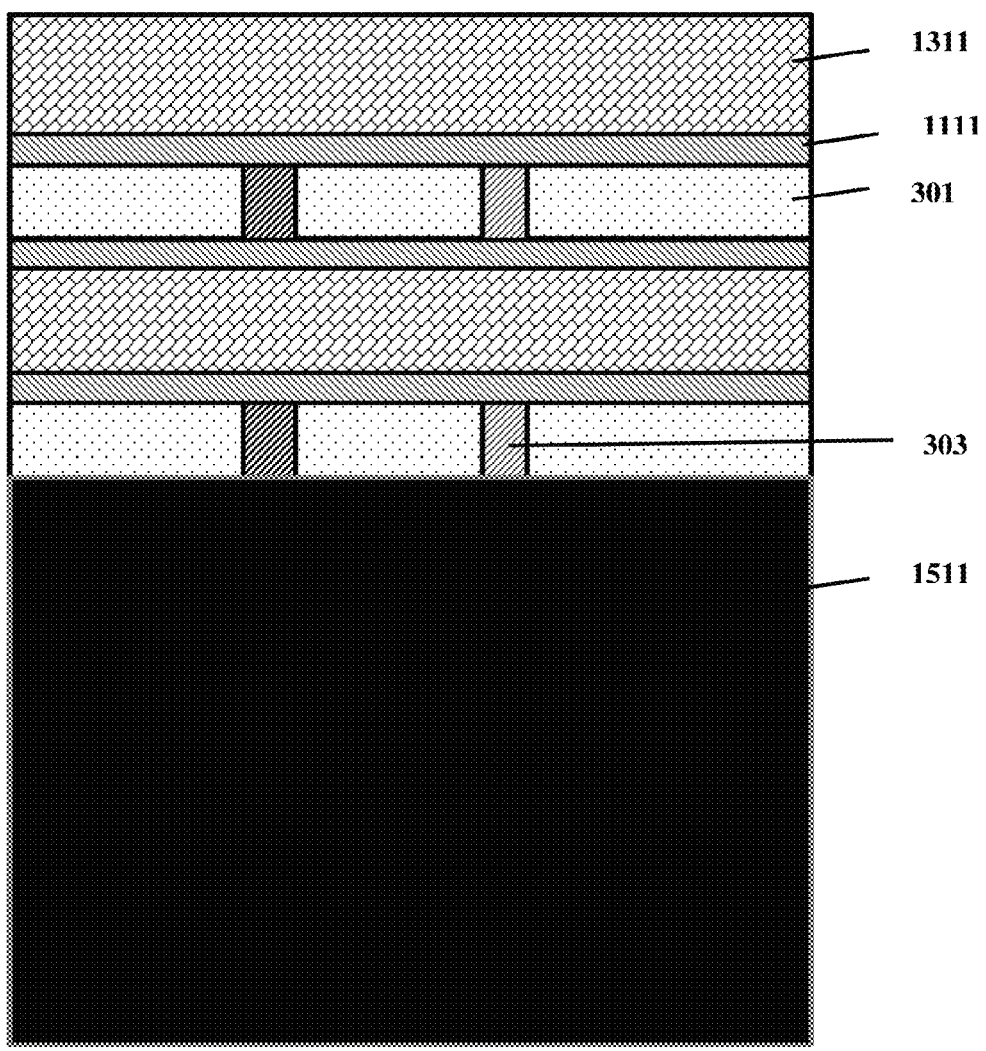
FIG. 18A illustrates a top view following the formation of a block mask over a portion of the dielectric material layer.

FIG. 18A illustrates a top view following the formation of a block mask 1511 over a portion of the dielectric material layer 1411. Following the patterning of the block mask, a selective etching process is performed that removes exposed portions of the dielectric layer 1411 to expose portions of the fins 303.

Figure 18B:
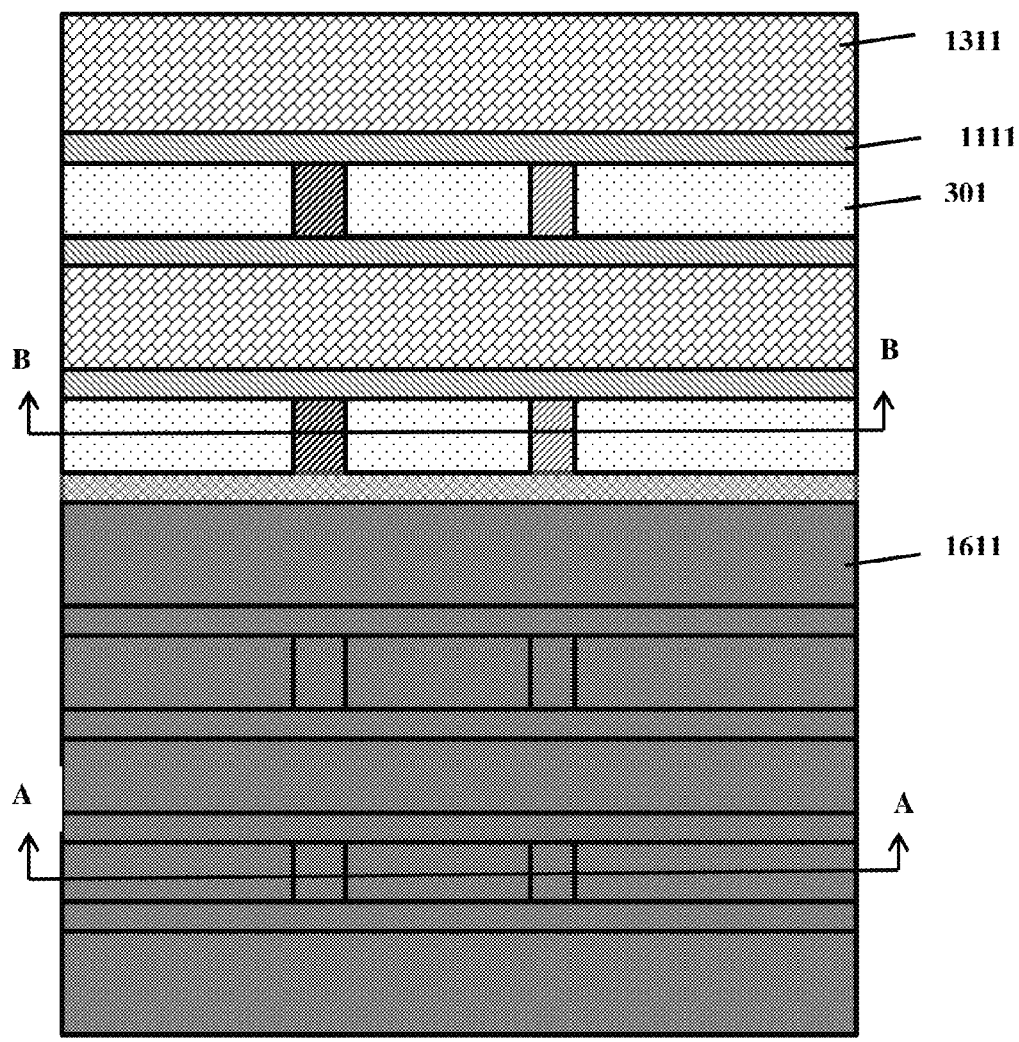
FIG. 18B illustrates a top view following the removal of the block mask of FIG. 18A.
Figure 18C:
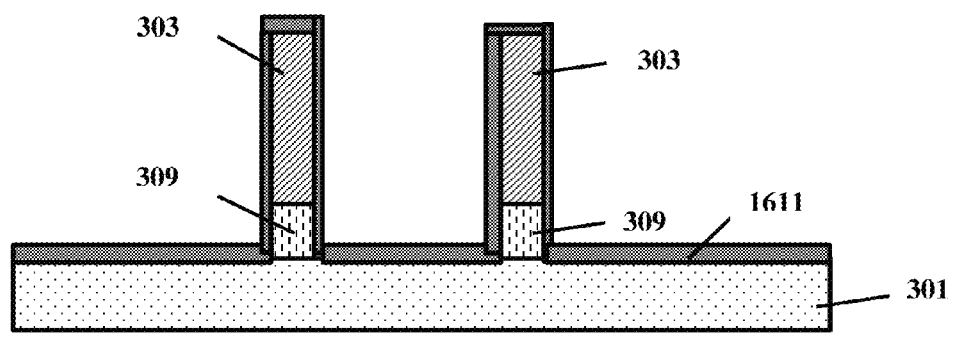
FIG. 18C illustrates a cut-away view of the structure along the line A-A of FIG. 18A.
Figure 18D:
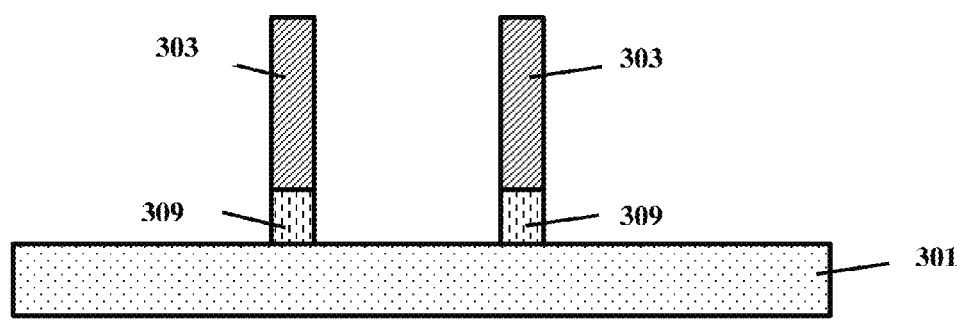
FIG. 18D illustrates a cut-away view of the structure along the line B-B of FIG. 18A.

FIG. 18B illustrates a top view following the removal of the block mask 1511 of FIG. 18A. FIG. 18C illustrates a cut-away view along the line A-A of FIG. 18A. FIG. 18D illustrates a cut-away view along the line B-B of FIG. 18A.

Figure 19A:
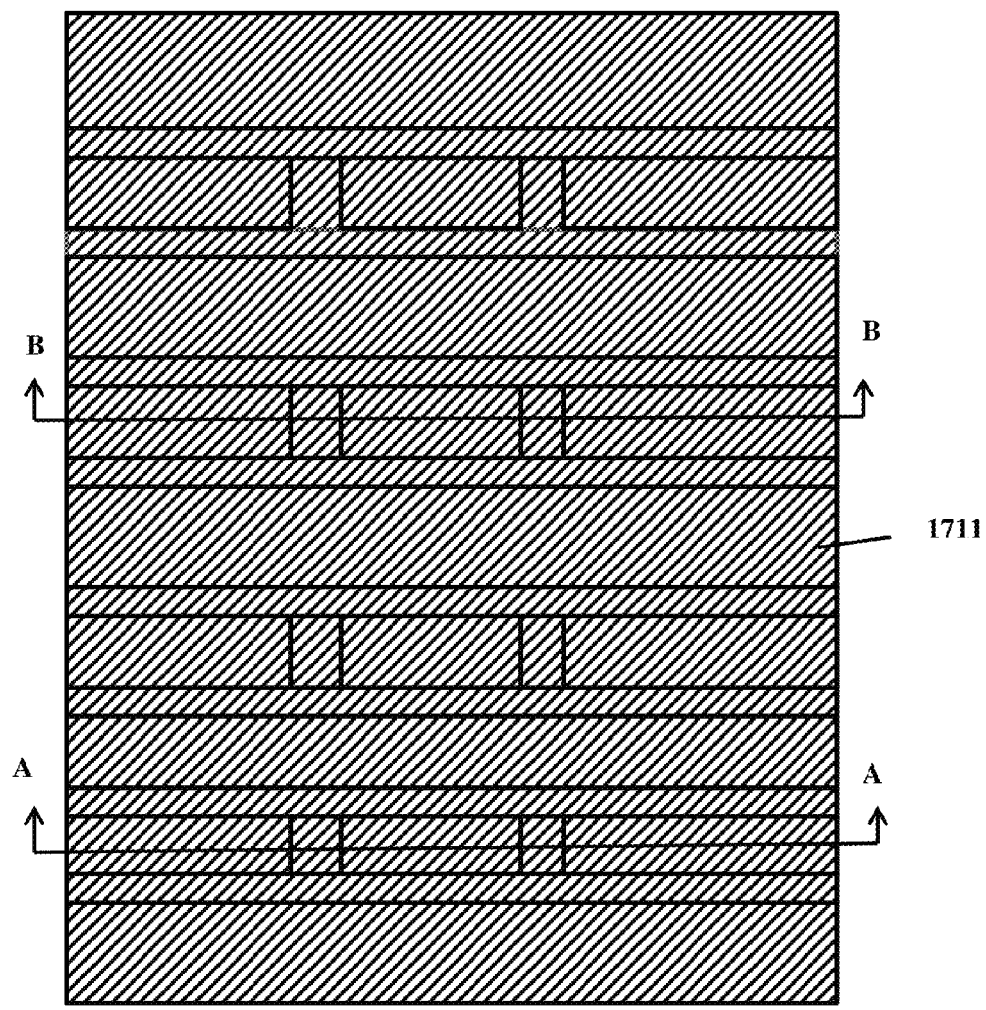
FIG. 19A illustrates a top view of the formation of a high-k dielectric layer.

FIG. 19A illustrates a top view of the formation of a high-k dielectric layer 1711. The high-k dielectric layer 1711 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Figure 19B:
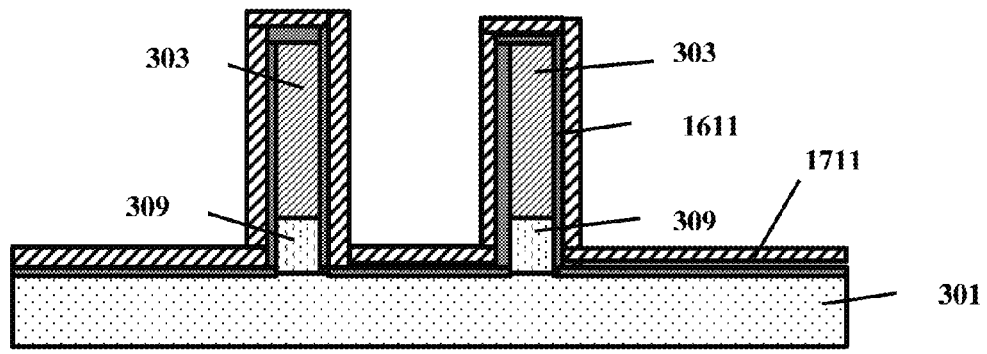
FIG. 19B illustrates a cut-away view of the structure along the line A-A of FIG. 19A.

FIG. 19B illustrates a cut-away view along the line A-A of FIG. 19A. The channel region shown includes a III-V compound fin 303 with a first dielectric layer 309 arranged between the fin 303 and substrate 301, a second dielectric layer 1611 arranged on the fin 303 and sidewalls of the first dielectric layer 309, the high-k dielectric layer 1711 arranged on the second dielectric layer 1611.

Figure 19C:
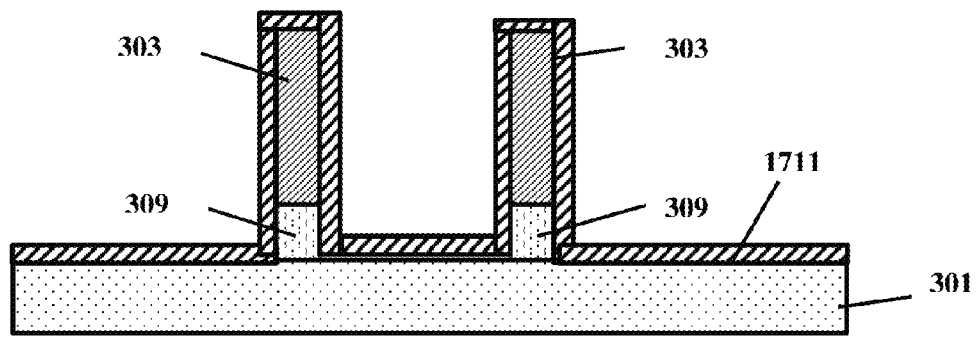
FIG. 19C illustrates a cut-away view of the structure along the line B-B of FIG. 19A.

FIG. 19C illustrates a cut-away view along the line B-B of FIG. 19A. The channel region of the fin 303 in the illustrated region includes the III-V compound material fin 303 and the high-k dielectric material layer 1711 arranged on the fin 303.

Figure 20A:
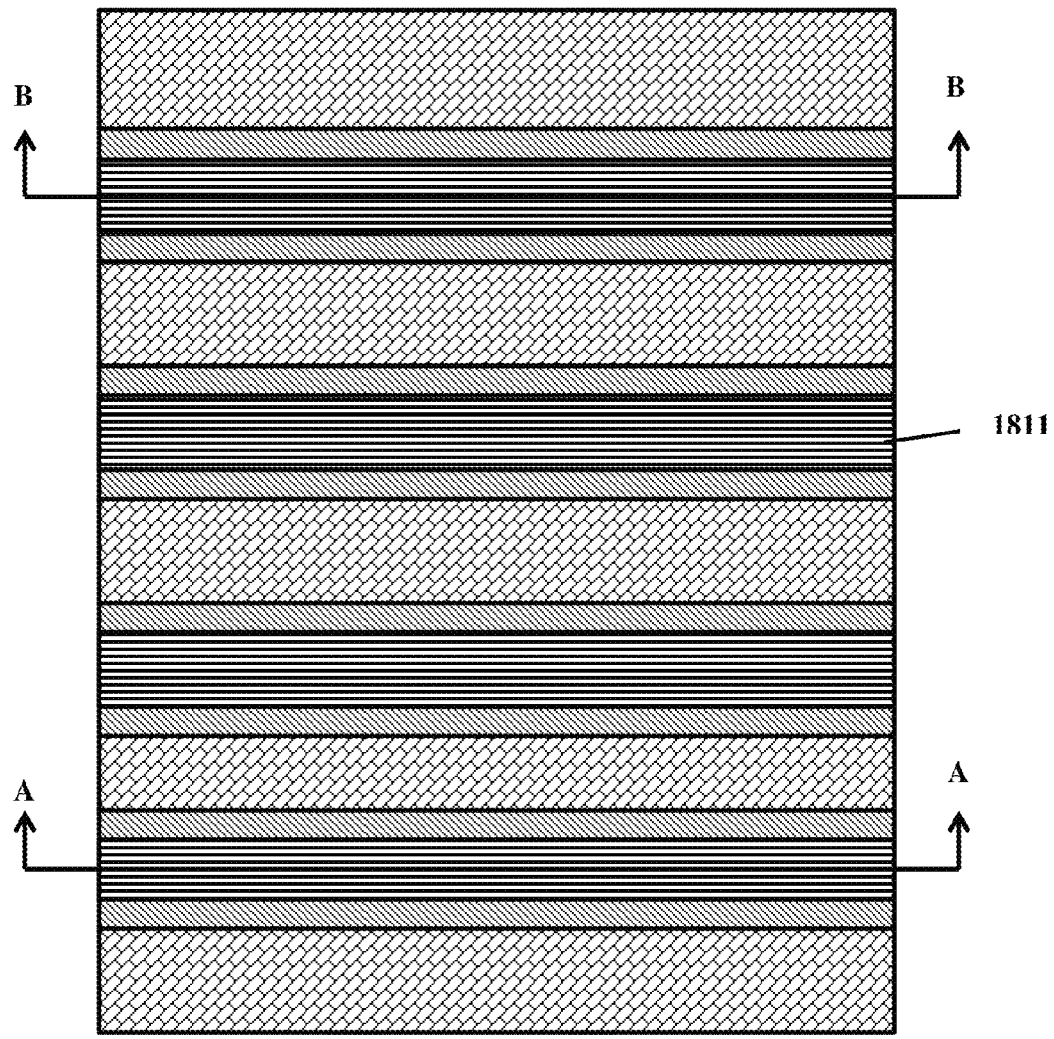
FIG. 20A illustrates the resultant structure following the formation of work function metal.

FIG. 20A illustrates the resultant structure following the formation of work function metal(s) 1811 disposed over the high-k dielectric material layer 1711 (FIG. 19B). The type of work function metal(s) depends on the type of device. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal 1811 is formed by a deposition process such as, for example, a spin-on process, chemical vapor deposition (CVD), atomic layer deposition (ALD), evaporation, physical vapor deposition (PVD) followed by a planarization process such as chemical mechanical polishing.

Figure 20B:
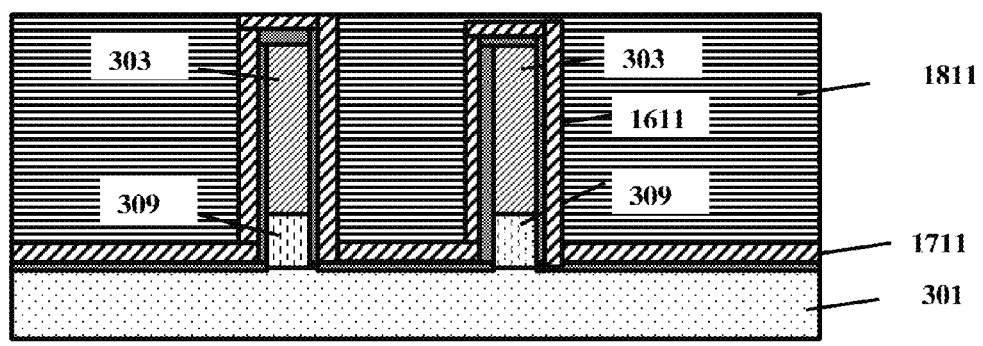
FIG. 20B illustrates a cut-away view of the structure along the line A-A of FIG. 20A.

FIG. 20B illustrates a cut-away view along the line A-A of FIG. 20A. The gate stack shown in FIG. 20B includes a III-V compound material fin 303 arranged on dielectric layer 309, a dielectric layer 1611 arranged on the dielectric layer 309 and the fin 303, and a high-k dielectric layer 1711 arranged on the dielectric layer 1611.

Figure 20C:
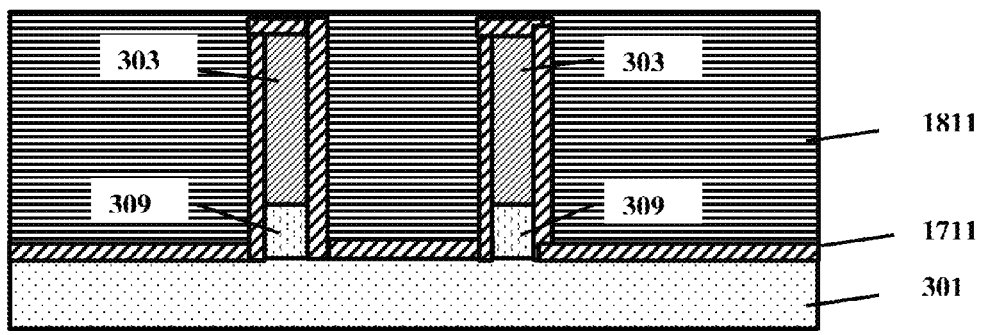
FIG. 20C illustrates a cut-away view of the structure along the line B-B of FIG. 20A.

FIG. 20C illustrates a cut-away view along the line B-B of FIG. 20A. The gate stack of FIG. 20B has a single high-k dielectric layer 1711 arranged on the fin 303 and dielectric layer 309.

Though the illustrated embodiments include a test structure with devices that include active regions formed from fins, alternate embodiments may include active regions with any suitable geometries, including other types of multi-gate devices, nanowire, and other types of gate-all-around devices that include evenly spaced gates having different thicknesses of dielectric materials and different gate widths.

Thus, the exemplary embodiment of the test structure includes gate stacks having different widths, and different thicknesses of dielectric materials. The gate stacks are evenly spaced.

When measuring the actual gate lengths of the resultant devices, the testing arrangement provides for measuring the capacitance of the devices in the test structure. Since the gates of the devices are evenly spaced, have different widths, and different dielectric material properties, the parasitic capacitances of the devices may be differentiated from the actual capacitance of the devices. Once the parasitic capacitance is known, and the actual capacitance of the devices is determined, the widths of the gates may be mathematically determined as a function of the capacitance.

As used herein, the terms "invention" or "present invention" are non-limiting terms and not intended to refer to any single aspect of the particular invention but encompass all possible aspects as described in the specification and the claims.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A method for fabricating a fin field effect transistor, the method comprising:
   depositing an aluminum-base interlayer on a silicon substrate, the aluminum-base interlayer having a thickness of less than about 100 nanometers;
   growing a III-V compound material on the aluminum-base interlayer;
   forming a III-V compound material fin;
   forming at least one sacrificial gate stack over the fin;
   forming source/drain regions on exposed portions of the fin;
   removing the sacrificial gate to expose channel regions of the fin;
   depositing a layer of dielectric material over the channel regions of the fin;
   depositing a block mask to obscure a channel region of the fin;
   removing the layer of dielectric material from exposed channel regions of the fin;

removing the block mask;
depositing a high-k dielectric layer; and
depositing a work function metal to form a gate stack.

2. The method of claim 1, further comprising forming spacers adjacent to the sacrificial gate stack prior to forming the source/drain regions.

3. The method of claim 1, wherein the layer of the dielectric material includes a low-k dielectric material.

* * * * *